(12) United States Patent
Lu et al.

(10) Patent No.: US 11,307,499 B2
(45) Date of Patent: Apr. 19, 2022

(54) SPLICING NANO-IMPRINT TEMPLATE WITH REPAIR ADHESIVE LAYER, REPAIR METHOD OF SPLICING SEAM THEREOF, AND MANUFACTURING METHOD THEREOF

(71) Applicant: BOE TECHNOLOGY GROUP CO., LTD., Beijing (CN)

(72) Inventors: Yanhui Lu, Beijing (CN); Duohui Li, Beijing (CN); Xueyuan Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/830,820

(22) Filed: Mar. 26, 2020

(65) Prior Publication Data
US 2021/0157240 A1 May 27, 2021

(30) Foreign Application Priority Data
Nov. 26, 2019 (CN) .......................... 201911176775.3

(51) Int. Cl.
*G03F 7/20* (2006.01)
*B29C 65/52* (2006.01)
*H01L 21/027* (2006.01)

(52) U.S. Cl.
CPC .......... *G03F 7/2002* (2013.01); *B29C 65/526* (2013.01); *H01L 21/027* (2013.01); *H01L 21/0275* (2013.01)

(58) Field of Classification Search
CPC ..... G03F 7/2002; G03F 7/0002; B29C 65/526; B29C 73/00; H01L 21/027; H01L 21/0275
See application file for complete search history.

(56) References Cited

U.S. PATENT DOCUMENTS

| | | | |
|---|---|---|---|
| 8,236,464 B1* | 8/2012 | Shih | G03F 1/76 430/5 |
| 8,703,406 B2* | 4/2014 | Schaper | G03F 7/0002 430/323 |
| 2010/0140220 A1* | 6/2010 | Cho | B82Y 40/00 216/41 |
| 2013/0153534 A1* | 6/2013 | Resnick | B29D 11/0074 216/24 |
| 2015/0323721 A1* | 11/2015 | Chung | G02F 1/133528 349/96 |
| 2016/0231621 A1* | 8/2016 | Kim | G02F 1/133536 |
| 2016/0288373 A1* | 10/2016 | Kim | G03F 7/0002 |

(Continued)

*Primary Examiner* — John P. Dulka
(74) *Attorney, Agent, or Firm* — Collard & Roe, P.C.

(57) ABSTRACT

Embodiments of the present disclosure provide a splicing nano-imprint template, a repair method of a splicing seam thereof, and a manufacturing method thereof. The repair method of the splicing seam of the splicing nano-imprint template includes: providing a splicing nano-imprint plate, in which the splicing nano-imprint plate includes a base substrate and splicing modules that are positioned on the base substrate, a splicing seam is provided between adjacent spicing modules, and each of the splicing modules includes a unit pattern; forming a repair adhesive layer at least at the splicing seam; and performing a patterning process on the repair adhesive layer to form a repair module, in which the repair module includes the unit pattern.

18 Claims, 7 Drawing Sheets

(56) References Cited

U.S. PATENT DOCUMENTS

2016/0306275 A1* 10/2016 Park ..................... G03F 7/0002
2017/0336547 A1* 11/2017 Park ..................... G03F 7/0002
2021/0080783 A1*  3/2021 Yan ................... G02F 1/133504

* cited by examiner

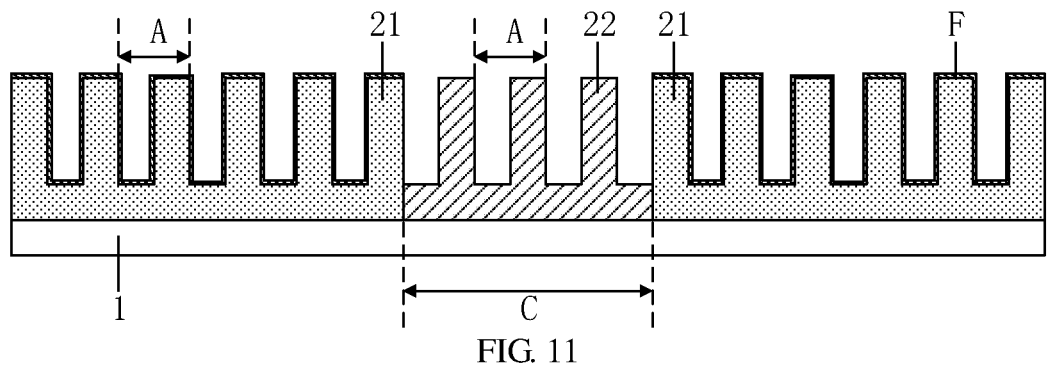
FIG. 11
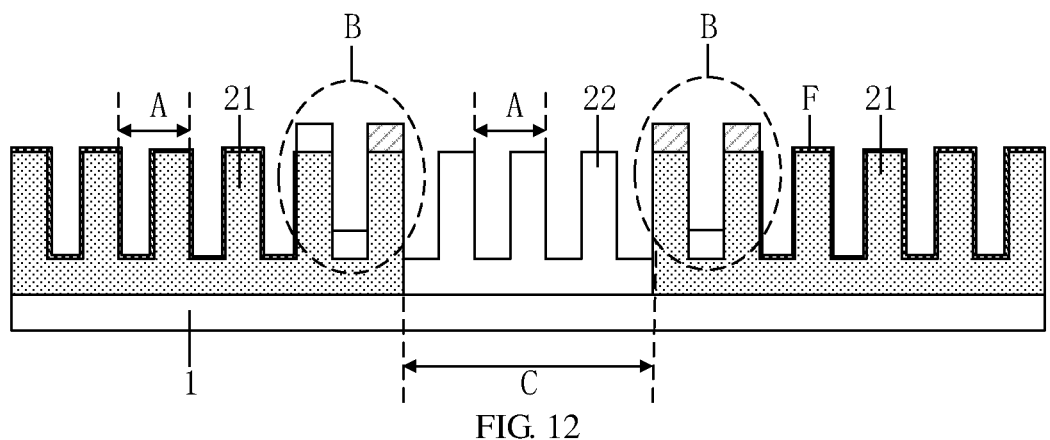
FIG. 12
| Irradiating a portion of a photoresist layer by using a femtosecond laser so that the photoresist layer includes a cured portion and an uncured portion | — S301' |
| Removing the uncured portion of the photoresist layer to form the repair module | — S302' |
FIG. 13

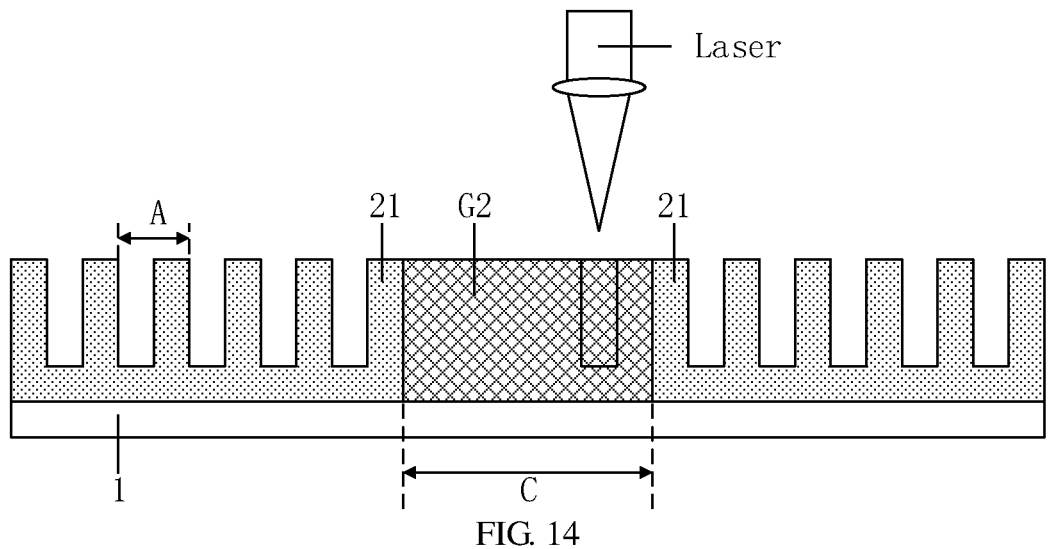

FIG. 14

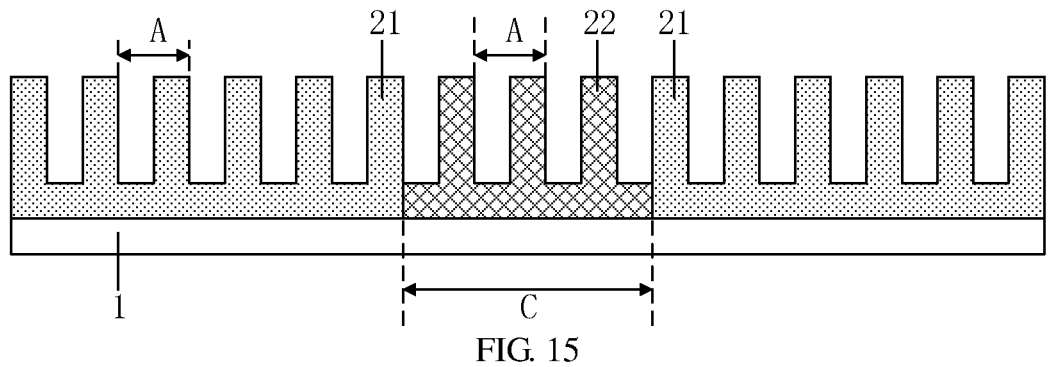

FIG. 15

| Providing a base substrate, the base substrate includes a plurality of splicing regions and the splicing seam positioned between adjacent splicing regions | — B1 |

↓

| Forming the plurality of splicing modules by using a nano-imprint method | — B2 |

↓

| Respectively fixing the plurality of splicing modules to the splicing regions of the base substrate to form the splicing nano-imprint plate | — B3 |

SPLICING NANO-IMPRINT TEMPLATE WITH REPAIR ADHESIVE LAYER, REPAIR METHOD OF SPLICING SEAM THEREOF, AND MANUFACTURING METHOD THEREOF

This application claims priority to Chinese Patent Application No. 201911176775.3, filed on Nov. 26, 2019, for all purposes under the U.S. law, the entire disclosure of which is incorporated herein by reference as part of the present application.

TECHNICAL FIELD

The present disclosure relates to a splicing nano-imprint template, a repair method of a splicing seam of the splicing nano-imprint template, and a manufacturing method of the splicing nano-imprint template.

BACKGROUND

Nano-imprint method is a new type of micro-structure manufacture method with high efficiency and high output, which can be used to manufacture micro-structures of micron-scale and nano-scale, and is widely used in the technical fields of photoelectric devices, semiconductors and the like.

At present, the method for manufacturing a nano-imprint template with large area mainly comprises splicing a plurality of nano-imprint templates with small area to form the splicing nano-imprint template with large area. However, the splicing of the nano-imprint templates with small area cannot achieve a seamless splicing, so that splicing seams usually exist in the splicing nano-imprint template with large area, and the splicing seams are generally micrometer-sized.

The splicing nano-imprint template, due to the existence of the splicing seams, on the one hand, will reduce the quality of the photoelectric devices manufactured by the splicing nano-imprint template, and on the other hand, is easy to take away a portion of imprint adhesive when the splicing nano-imprint template is demoulded, thus causing demoulding problems.

SUMMARY

According to at least one embodiment of the present disclosure, a repair method of a splicing seam of a splicing nano-imprint template is provided, which includes: providing a splicing nano-imprint plate, in which the splicing nano-imprint plate includes a base substrate and a plurality of splicing modules that are positioned on the base substrate, a splicing seam is provided between adjacent spicing modules, and each of the splicing modules includes a unit pattern; forming a repair adhesive layer at least at the splicing seam; and performing a patterning process on the repair adhesive layer to form a repair module, in which the repair module includes the unit pattern.

For example, the repair adhesive layer is an imprint adhesive layer; and the forming the repair adhesive layer at least at the splicing seam, includes: forming an anti-sticking layer on the splicing modules, and forming the imprint adhesive layer at the splicing seam as the repair adhesive layer.

For example, the performing the patterning process on the repair adhesive layer to form the repair module, includes: imprinting the imprint adhesive layer by using an imprint template, in which the imprint template includes the unit pattern; performing a curing process on the imprint adhesive layer by taking an edge of the imprint template as a boundary; and separating the imprint template from the imprint adhesive layer to form the repair module.

For example, the forming the anti-sticking layer on the splicing modules, includes: forming the anti-sticking layer on the splicing modules by using a printing method, in which a distance between an edge of the anti-sticking layer close to the splicing seam and an edge of one of the splicing modules close to the splicing seam is less than 1 micrometer.

For example, the edge of the anti-sticking layer close to the splicing seam is aligned with the edge of the one of the splicing modules close to the splicing seam.

For example, a material of the anti-sticking layer includes fluorine-containing silane-based compounds.

For example, the forming the repair adhesive layer at least at the splicing seam, includes: forming a photoresist layer at the splicing seam as the repair adhesive layer.

For example, the performing the patterning process on the repair adhesive layer to form the repair module, includes: irradiating a portion of the photoresist layer by using a femtosecond laser so that the photoresist layer includes a cured portion and an uncured portion; and removing the uncured portion of the photoresist layer to form the repair module.

For example, a wavelength range of the femtosecond laser is 700 nm-900 nm.

For example, the wavelength of the femtosecond laser is 800 nm.

According at least one embodiment of the present disclosure, a manufacturing method of a splicing nano-imprint template is provided, which includes the repair method described above. The manufacturing method further includes: providing the base substrate, in which the base substrate includes a plurality of splicing regions and the splicing seam positioned between adjacent splicing regions; forming the plurality of splicing modules by using a nano-imprint method; and respectively fixing the plurality of splicing modules to the splicing regions of the base substrate to form the splicing nano-imprint plate.

According at least one embodiment of the present disclosure, a splicing nano-imprint template is provided, which includes: a base substrate, and a nano-imprint structure, positioned on the base substrate, and including a plurality of splicing modules and a repair module that is positioned between adjacent splicing modules, in which the repair module and each of the splicing modules include a unit pattern.

For example, an edge of one of the splicing modules close to the repair module is in direct contact with an edge of the repair module close to the one of the splicing modules.

For example, each of the splicing modules includes a plurality of the unit patterns that are arranged according to a period, and the repair module includes a plurality of the unit patterns that are arranged according to the period.

For example, at an interface where the repair module and one of the splicing modules contact with each other, the period is continuous For example, each of the unit patterns includes a groove and a protrusion that are alternately provided; an edge of the one of the splicing modules close to the repair module is provided with the groove, and an edge of the repair module close to the one of the splicing modules is provided with the protrusion; or, the edge of the one of the splicing modules close to the repair module is provided with the protrusion, and the edge of the repair module close to the one of the splicing modules is provided with the groove.

For example, at an interface where the repair module and one of the splicing modules contact with each other, the period is discontinuous.

For example, each of the unit patterns includes a groove and a protrusion that are alternately provided; an edge of the one of the splicing modules close to the repair module is provided with the groove, and an edge of the repair module close to the one of the splicing modules is provided with the groove; or, the edge of the one of the splicing modules close to the repair module is provided with the protrusion, and the edge of the repair module close to the one of the splicing modules is provided with the protrusion.

For example, the splicing nano-imprint template further includes a seed layer, provided on a side of the nano-imprint structure away from the base substrate.

For example, a material of the seed layer includes nickel and/or copper.

BRIEF DESCRIPTION OF THE DRAWINGS

In order to clearly illustrate the technical solutions of the embodiments of the disclosure, the drawings of the embodiments will be briefly described in the following; and it is obvious that the described drawings are only related to some embodiments of the disclosure and thus are not limitative to the disclosure.

FIG. 11 is a schematic diagram of step S303 in the repair method of the splicing seam of the splicing nano-imprint template as shown in FIG. 8;

FIG. 12 is another schematic diagram of step S303 in the repair method of the splicing seam of the splicing nano-imprint template as shown in FIG. 8;

FIG. 13 is another flowchart schematic diagram of step S3 in the repair method of the splicing seam of the splicing nano-imprint template as shown in FIG. 1;

FIG. 14 is a schematic diagram of step S301' in the repair method of the splicing seam of the splicing nano-imprint template as shown in FIG. 13;

FIG. 15 is a schematic diagram of step S302' in the repair method of the splicing seam of the splicing nano-imprint template as shown in FIG. 13;

FIG. 16 is a flowchart schematic diagram of a manufacturing method of the splicing nano-imprint template according to the embodiments of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before "comprise," "comprising," "include," "including," etc., encompass the elements or the objects and equivalents thereof listed after "comprise," "comprising," "include," "including," etc., but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
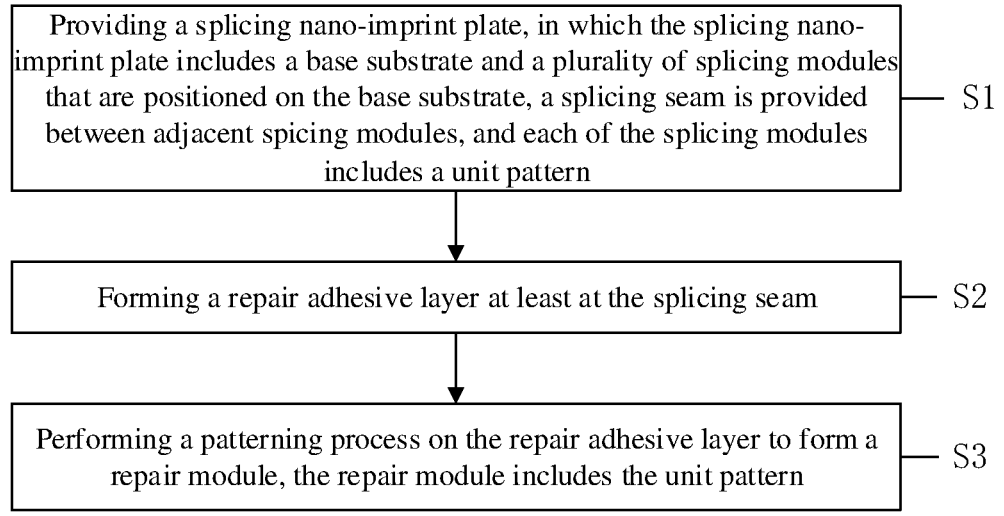
FIG. 1 is a flowchart schematic diagram of a repair method of a splicing seam of a splicing nano-imprint template according to embodiments of the present disclosure.

Embodiments of the present disclosure provides a repair method of a splicing seam of a splicing nano-imprint template, referring to FIG. 1, the repair method includes the following steps.

Figure 2:
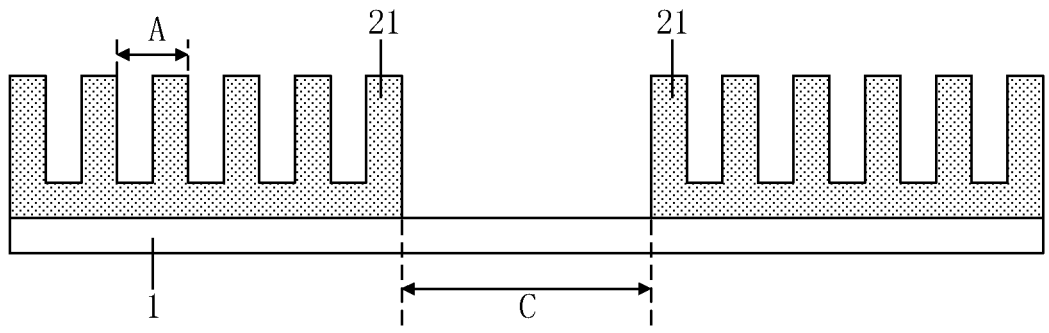
FIG. 2 is a schematic diagram of step S1 in the repair method of the splicing seam of the splicing nano-imprint template as shown in FIG. 1.

S1: as shown in FIG. 2, providing a splicing nano-imprint plate. The splicing nano-imprint plate includes a base substrate 1 and a plurality of splicing modules 21 that are positioned on the base substrate 1, a splicing seam C is provided between adjacent spicing modules 21, and each of the splicing modules 21 includes a unit pattern A. It should be noted that the pattern of each of the splicing modules 21 in the embodiments of the present disclosure is composed of the unit pattern A. Taking the splicing modules 21 shown in FIG. 2 as an example, each of the splicing modules 21 includes a plurality of repeated unit patterns A. The unit pattern A described in the embodiments of the present disclosure is characterized by, for example, the following parameters: a height of a protrusion, a depth of a groove, a distance between adjacent protrusions, distance between adjacent grooves, etc.

Figure 3:
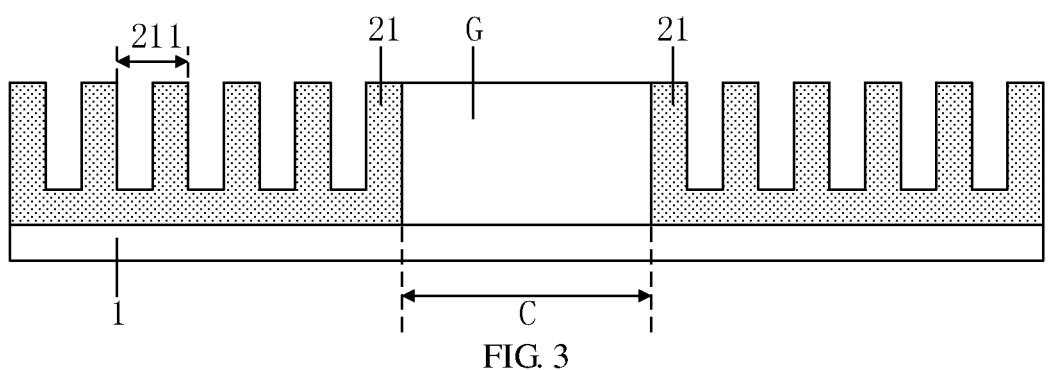
FIG. 3 is a schematic diagram of step S2 in the repair method of the splicing seam of the splicing nano-imprint template as shown in FIG. 1.

S2: as shown in FIG. 3, forming a repair adhesive layer G at least at the splicing seam C.

Figure 4A:
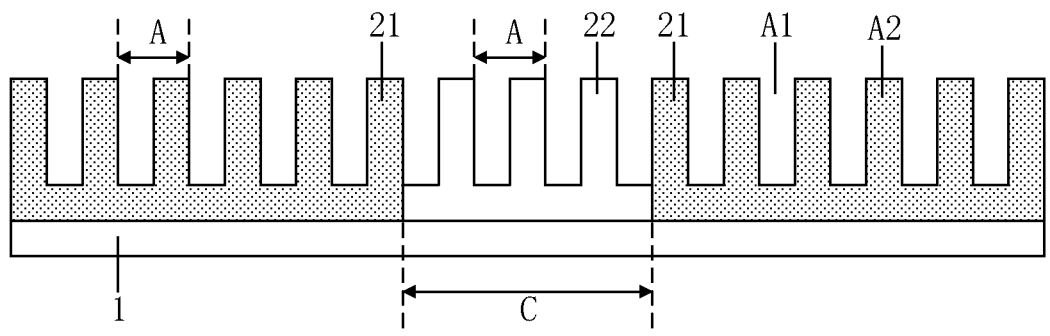
FIG. 4A is a schematic diagram of step S3 in the repair method of the splicing seam of the splicing nano-imprint template as shown in FIG. 1.
Figure 4B:
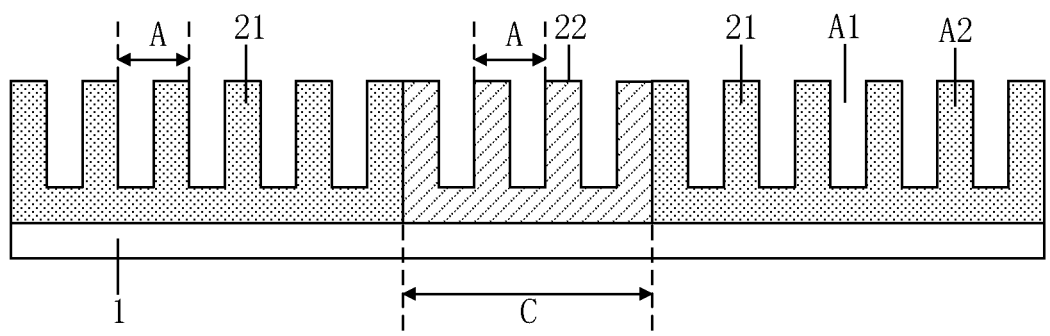
FIG. 4B is another schematic diagram of step S3 in the repair method of the splicing seam of the splicing nano-imprint template as shown in FIG. 1.
Figure 4C:
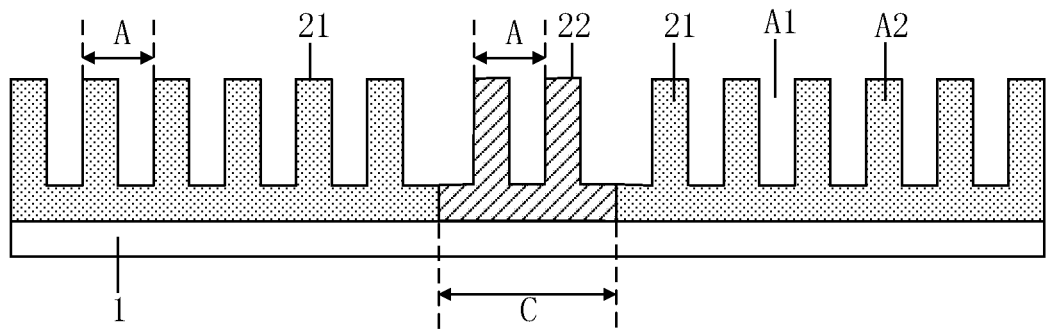
FIG. 4C is still another schematic diagram of step S3 in the repair method of the splicing seam of the splicing nano-imprint template as shown in FIG. 1.

S3: as shown in FIG. 4A to FIG. 4C, performing a patterning process on the repair adhesive layer G to form a repair module 22. The repair module 22 includes the unit pattern A.

According to the embodiments of the disclosure, the repair adhesive layer is formed at the splicing seam, the patterning process is performed on the repair adhesive layer to form the repair module 22, and the repair module 22 and each of the splicing modules 21 include the unit pattern A, so that the splicing seam of the splicing nano-imprint template is repaired, and the splicing nano-imprint template without the seams can be manufactured. The seamless splicing nano-imprint template not only helps to improve the quality of photoelectric devices, but also solves the demoulding problem caused by the splicing seams.

It should be noted that the total number of the splicing modules 21 included in the splicing nano-imprint template may be flexibly selected according to actual requirements. For example, the splicing nano-imprint template includes ten of the splice modules 21.

For example, along an arrangement direction of the plurality of splicing modules 21, a size of each of the splicing modules 21 is larger than a size of the splicing seam C. For example, along the arrangement direction of the plurality of splicing modules 21, the size of the splicing seam C is on the order of micrometers, and the size of each of the splicing modules 21 is on the order of millimeters. In other words, the size of each of the splicing modules 21 is about 1000 times as large as the size of the splicing seam C.

For example, as shown in FIG. 4A to FIG. 4C, after completing the above repair method, the edge of one of the splicing modules 21 close to the repair module 22 is in direct contact with the edge of the repair module 22 close to the one of the splicing modules 21, thus obtaining the seamless splicing nano-imprint template.

For example, as shown in FIG. 4A to FIG. 4C, each of the splicing modules 21 includes a plurality of the unit patterns A that are arranged according to a period, and the repair module 22 includes a plurality of the unit patterns A that are arranged according to the period as well. That is, the period of arrangement of the plurality of unit patterns A in the repair module 22 is the same as the period of arrangement of the plurality of unit patterns A in each of the splicing modules 21.

For example, as shown in FIG. 4A, at an interface where the repair module 22 and one of the splicing modules 21 contact with each other, the period is continuous. Further, for example, each of the unit patterns A includes a groove A1 and a protrusion A2. The edge of the one of the splicing modules 21 close to the repair module 22 is provided with the groove A1, and the edge of the repair module 22 close to the one of the splicing modules 21 is provided with the protrusion A2. Or, the edge of the one of the splicing modules 21 close to the repair module 22 is provided with the protrusion A2, and the edge of the repair module 22 close to the one of the splicing modules 21 is provided with the groove A1.

For example, as shown in FIG. 4B and FIG. 4C, at the interface where the repair module 22 and one of the splicing modules 21 contact with each other, the period is discontinuous. Because the size of the splice seam C is very small, generally on the order of micrometers, even if the period is discontinuous at the interface where the repair module 22 and one of the splicing modules 21 contact with each other, the normal usage of the splicing nano-imprint template will not be affected. Because the period is discontinuous at the interface where the repair module 22 and one of the splicing modules 21 contact with each other, the difficulty of forming the repair module 22 is greatly reduced, and the repair method of the splicing seam of the splicing nano-imprint template is simplified. For example, each of the unit patterns A comprises the groove A1 and the protrusion A2, the edge of the one of the splicing modules 21 close to the repair module 22 is provided with the groove A1, and the edge of the repair module 22 close to the one of the splicing modules 21 is provided with the groove A1. Or, the edge of the one of the splicing modules 21 close to the repair module 22 is provided with the protrusion A2, and the edge of the repair module 22 close to the one of the splicing modules 21 is provided with the protrusion A2.

Figure 5:
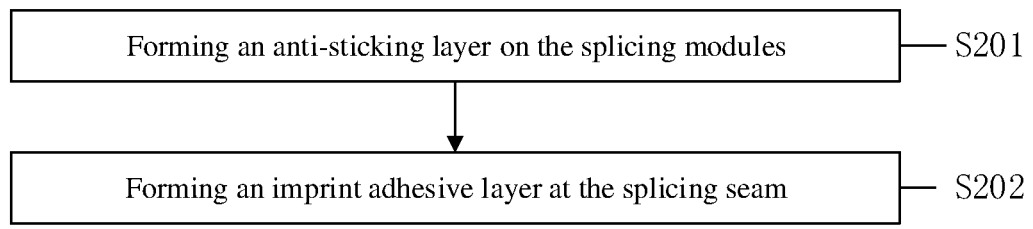
FIG. 5 is a flowchart schematic diagram of step S2 in the repair method of the splicing seam of the splicing nano-imprint template as shown in FIG. 1.

For example, the repair adhesive layer G in the embodiments of the present disclosure is an imprint adhesive layer, referring to FIG. 5, in the repair method provided in the embodiments of the present disclosure, step S2 includes the following steps.

Figure 6:
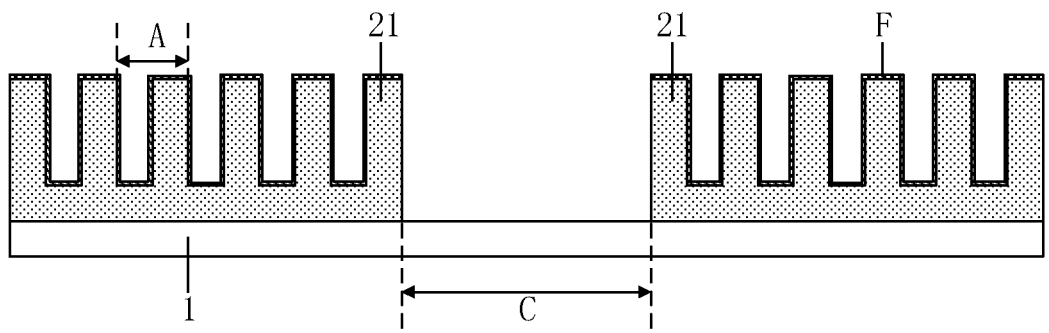
FIG. 6 is a schematic diagram of step S201 in the repair method of the splicing seam of the splicing nano-imprint template as shown in FIG. 5.

S201: as shown in FIG. 6, forming an anti-sticking layer F on the splicing modules 21. For example, the anti-sticking layer F is formed on the splicing modules 21 by using a printing method; the anti-sticking layer F is formed on the splicing modules 21 by using the printing method in order to prevent the material of the anti-sticking layer F from covering the splicing seam C. For example, the distance between the edge of the anti-sticking layer F close to the splicing seam C and the splicing seam C is less than 1 micrometer. That is, the distance between the edge of the anti-sticking layer F close to the splicing seam C and the edge of one of the splicing modules 21 close to the splicing seam C is less than 1 micrometer, so that the anti-sticking layer F covers the splicing modules 21 as much as possible to facilitate that the subsequent imprint adhesive layer G1 is formed at the splicing seam C and not at the splicing modules 21. For example, the material of the anti-sticking layer F includes fluorine-containing silane-based compounds.

For example, the edge of the anti-sticking layer F close to the splicing seam C is aligned with the edge of one of the splicing modules 21 close to the splicing seam C. That is, the distance between the edge of the anti-sticking layer F close to the splicing seam C and the splicing seam C is 0 micrometer. Under this case, the anti-sticking layer F covers the entirety of the splicing modules 21 and does not cover the splicing seam C, so that the subsequent imprint adhesive layer G1 is conveniently formed only at the splicing seam C.

Figure 7:
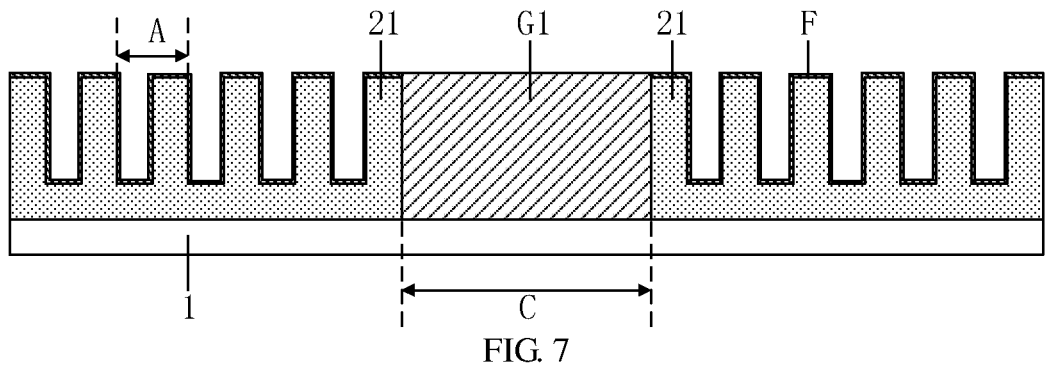
FIG. 7 is a schematic diagram of step S202 in the repair method of the splicing seam of the splicing nano-imprint template as shown in FIG. 5.

S202: as shown in FIG. 7, forming the imprint adhesive layer G1 at the splicing seam C by using a spraying method, a printing method, or a spin coating method. Because the anti-sticking layer F is formed on the splicing modules 21 and the imprint adhesive cannot adhere to the anti-sticking layer F, therefore, whether the spraying method, the printing method, or the spin coating method is used during forming the imprint adhesive layer G1, the imprint adhesive layer G1 is only formed at the splicing seam C. The imprint adhesive layer G1 is an example of the repair adhesive layer G as described above.

In the embodiments of the present disclosure, by forming the anti-sticking layer F on the splicing modules 21, it can be ensured that the imprint adhesive layer G1 is only formed at the splicing seam C, which is conducive to flexibly selecting the method for forming the imprint adhesive layer G1.

Figure 8:
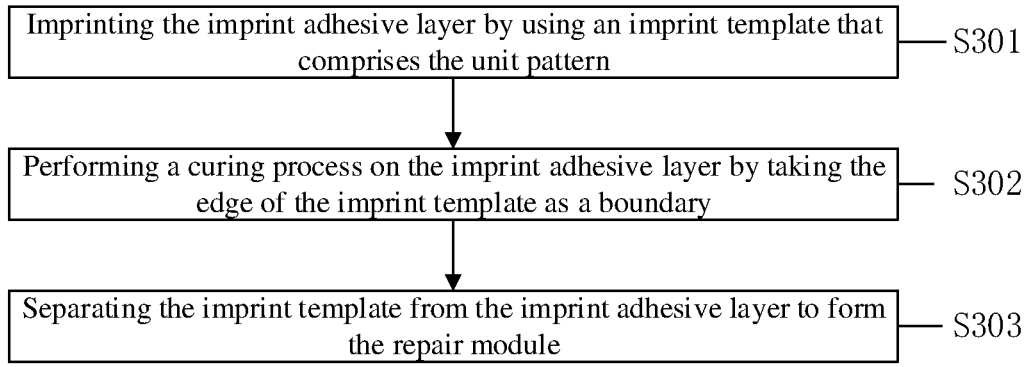
FIG. 8 is a flowchart schematic diagram of step S3 in the repair method of the splicing seam of the splicing nano-imprint template as shown in FIG. 1.

Further, as shown in FIG. 8, in the repair method provided by the embodiments of the present disclosure, step S3 includes the following steps.

Figure 9:
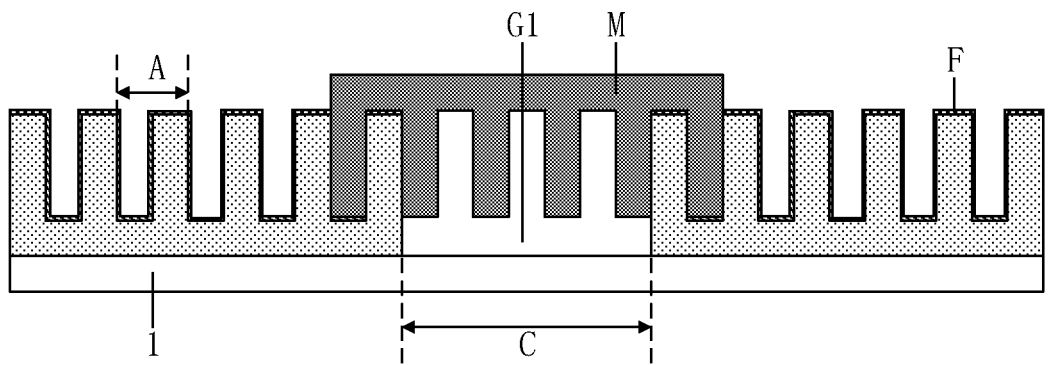
FIG. 9 is a schematic diagram of step S301 in the repair method of the splicing seam of the splicing nano-imprint template as shown in FIG. 8.

S301: as shown in FIG. 9, imprinting the imprint adhesive layer G1 by using an imprint template M that comprises the unit pattern A. For example, the imprint template M is the imprint template for manufacturing the splicing modules 21.

For example, in the arrangement direction of the splicing modules 21, the size of the imprint template M is not smaller than the size of the splicing seam C.

Figure 10:
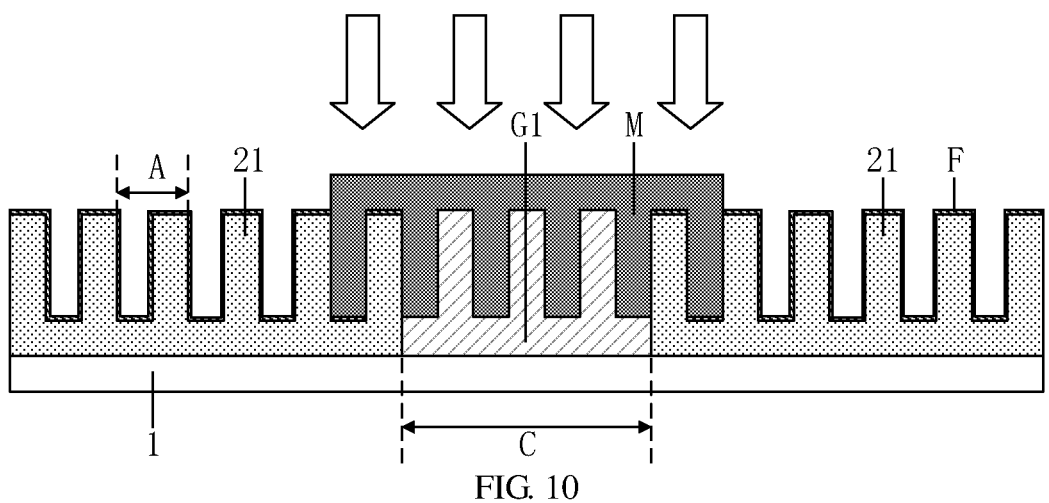
FIG. 10 is a schematic diagram of step S302 in the repair method of the splicing seam of the splicing nano-imprint template as shown in FIG. 8.

S302: as shown in FIG. 10, performing a curing process on the imprint adhesive layer G1 by taking the edge of the imprint template M as a boundary. That is, the curing process is performed within a region of the imprint template M. For example, a UV curing or a thermal curing is used.

S303: as shown in FIG. 11, separating the imprint template M from the imprint adhesive layer G1 to form the repair module 22.

In the repair method provided by the embodiments of the present disclosure, the nano-imprint method is used to repair the splicing seam C, so that the repair method is simple, and the splicing seam C is repaired without adding additional equipments and additional imprint templates.

Further, as shown in FIG. 12, in the case that there is a certain distance between the edge of the anti-adhesive layer F close the splicing seam C and the splicing seam C (for example, the distance is greater than 1 micrometer), that is, there is a certain distance between the edge of the anti-adhesive layer F close the splicing seam C and the edge of one of the slicing modules 21 close to the splicing seam C (for example, the distance is greater than 1 micrometer), the imprint adhesive layer G1 may be further formed in the region of the splicing modules 21 that is not covered by the anti-sticking layer F; therefore, the unit pattern A at the position where the imprinting adhesive layer G1 is formed on the splicing modules 21 (i.e., at the region B within the dashed circle in FIG. 12) has a segment difference from the unit pattern A of the splicing modules 21 except for the unit pattern at the region B. If such splicing nano-imprint template is applied to perform the imprinting process on the component to be imprinted, the influence of the segment difference on the imprint precision is acceptable, especially in the case that the component to be imprinted is provided with a flexible base substrate. Therefore, the segment difference has little influence on the imprint precision, and the segment difference is allowable to exist in the splicing nano-imprint template.

For example, the repair adhesive layer G in the embodiments of the present disclosure is a photoresist layer, referring to FIG. 13, in the repair method provided by the embodiments of the disclosure, step S3 includes the following steps.

S301': as shown in FIG. 14, irradiating a portion of the photoresist layer G2 by using a femtosecond laser so that the photoresist layer G2 includes a cured portion and an uncured portion. For example, the wavelength range of the femtosecond laser is 700 nm-900 nm, further, for example, the wavelength of the femtosecond laser is 800 nm. Under this case, the femtosecond laser has a long wavelength, so that the femtosecond laser achieves a large irradiation depth into photoresist layer G2, which is beneficial to form the unit pattern A. for example, the femtosecond laser is controlled to irradiate the portion of the photoresist layer G2 by using a programming method, so that the photoresist layer G2 includes the cured portion and the uncured portion. The photoresist layer G2 is another example of the repair adhesive layer G as described above.

S302': as shown in FIG. 15, removing the uncured portion of the photoresist layer G2 to form the repair module 22. For example, the material of the photoresist layer G2 includes a positive photoresist or a negative photoresist. In the case that the material of the photoresist layer G2 includes the positive photoresist, because the solubility of the positive photoresist in solvent increases under the irradiation of the femtosecond laser, the portion of the photoresist layer G2 requiring the irradiation of the femtosecond laser is the portion of the photoresist layer G2 requiring to be removed. In the case that the material of the photoresist layer G2 includes the negative photoresist, because the negative photoresist is solidified under the irradiation of the femtosecond laser, the portion of the photoresist layer G2 requiring the irradiation of the femtosecond laser is the portion of the photoresist layer G2 requiring to be remained.

The femtosecond laser method (that is, a two-photon polymerization method) adopted by the embodiments of the present disclosure is used to realize the patterning of the photoresist layer G2 at the splicing seam C without forming the anti-sticking layer, so that step S2, for example, comprises forming the photoresist layer G2 at the splicing seam C by a spraying method or a printing method.

The femtosecond laser method (that is, the two-photon polymerization method) adopted by the embodiments of the present disclosure is used to realize the patterning of the photoresist layer G2 at the splicing seam C. The light intensity of the femtosecond laser has a Gaussian distribution, and the dissolving or solidifying of photoresist layer G2 has a specific energy threshold. Although the light spot of the femtosecond laser is at a micrometer level after focusing of the femtosecond laser, the energy density in the edge region of the light spot is not enough to reach the threshold value required for dissolving or solidifying the photoresist layer. Only the energy density in the diameter range of tens of nanometers at the focal point of the light spot can reach the threshold value required for dissolving or solidifying the photoresist layer, so that the manufacturing precision can reach tens of nanometers, and the repair module 22 at the splicing seam C has high precision.

The embodiments of the present disclosure provide a manufacturing method of a splicing nano-imprint template, which include the repair method of the splicing seam of the splicing nano-imprint template described above according to the embodiments of the present disclosure. Referring to FIG. 16, the manufacturing method provided by the embodiments of the present disclosure further includes the following steps.

B1: providing a base substrate. The base substrate includes a plurality of splicing regions and the splicing seam positioned between adjacent splicing regions.

B2: forming the plurality of splicing modules by using a nano-imprint method. For example, the plurality of splicing modules are formed by the nano-imprint method by using the imprint template M as described above.

B3: respectively fixing the plurality of splicing modules to the splicing regions of the base substrate to form the splicing nano-imprint plate.

It should be noted that in the embodiments of the present disclosure, the sequence of step B1 and step B2 may be reversed, that is, the plurality of splicing modules are formed before providing the base substrate.

In the embodiments of the present disclosure, the plurality of splicing modules are fixed to the base substrate to form the splicing nano-imprint plate, and the splicing seam of the splicing nano-imprint plate is repaired, so that the beneficial effects of the repair method of the splicing seam of the splicing nano-imprint template as described above can be obtained, which will not be repeated here.

Figure 17:
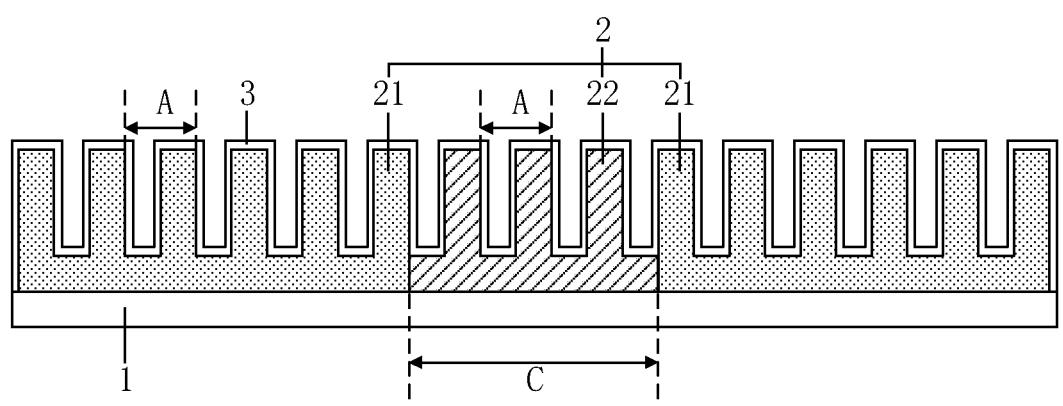
FIG. 17 is a structural schematic diagram of the splicing nano-imprint template according to the embodiments of the present disclosure.

For example, the manufacturing method provided by the embodiments of the present disclosure further includes: as shown in FIG. 17, forming a seed layer 3. The seed layer 3 is provided on the side of the repair module 22 and the spicing modules 21 away from the base substrate 1. For example, the material of the seed layer 3 includes relatively stable metals such as nickel, copper, etc. A nickel layer or a copper layer is formed as the seed layer 3 on the side of the repair module 22 and the splice modules 21 away from the base substrate 1 for example by using an electroplating method. The formation of the seed layer 3 is beneficial to form a metal nano-imprint template with patterns complementary to the patterns of the nano-imprint template by using the nano-imprint template according to the embodiments of the present disclosure, and the metal nano-imprint template has stable properties and wider application range.

The embodiments of the present disclosure provide a splicing nano-imprint template, as shown in FIG. 17, which includes the base substrate 1, a nano-imprint structure 2, and the seed layer 3.

The nano-imprint structure 2 is positioned on the base substrate 1, and includes the plurality of splicing modules 21 and the repair module 22 that is positioned between adjacent splicing modules 21. The repair module 22 and each of the splicing modules 21 both include the unit pattern A. For example, the material of the repair module 22 includes the imprint adhesive or the photoresist, and the photoresist is the positive photoresist or the negative photoresist. The seed layer 3 is provided on the side of the nano-imprint structure 2 away from the base substrate 1. For example, the material of the seed layer 3 includes relatively stable metals such as nickel, copper, etc.

According to the splicing nano-imprint template provided by the embodiments of the present disclosure, a position between adjacent splicing modules 21 is filled by the repair module 22, that is, the splicing seam C is filled by the repair module 22, so that the splicing nano-imprint template has no structural defects. Therefore, the splicing nano-imprint template can not only realize the advantages of large area and easy demoulding, but also the photoelectric devices manufactured by the splicing nano-imprint template provided by the embodiments of the present disclosure has better performance.

By applying the embodiments of the present disclosure, at least the following beneficial effects can be realized.

The embodiments of the present disclosure provide the splicing nano-imprint template, the repair method of the splicing seam of the splicing nano-imprint template, and the manufacturing method of the splicing nano-imprint template. By forming the repair adhesive layer at the splicing seam and patterning the repair adhesive layer to form the repair module, the repair module and each of the splicing modules both include the unit pattern, so that the splicing seam of the splicing nano-imprint template is repaired, and the seamless splicing nano-imprint template is manufactured. The seamless splicing nano-imprint template not only helps to improve the quality of photoelectric devices, but also solves the demoulding problem caused by the splicing seam.

Those skilled in the art can understand that various operations, methods, and steps, measures, and solutions in the process that have been discussed in the present disclosure can be alternated, modified, combined, or deleted.

It should be understood that although various steps in the flowchart of the accompanying drawings are shown in sequence as indicated by arrows, these steps are not necessarily executed in sequence as indicated by the arrows. Unless explicitly stated in the present disclosure, the execution of these steps is not strictly limited in sequence, but may be performed in other sequences. Moreover, at least a part of the steps in the flowchart of the accompanying drawings may include a plurality of sub-steps or a plurality of stages. The plurality of sub-steps or the plurality of stages are not necessarily completed at the same time, but may be executed at different times, of which the execution order is not necessarily sequentially, but may be executed in turn or alternately with other steps, sub-steps of other steps, or at least a part of stages of other steps.

What are described above is related to the exemplary embodiments of the disclosure only and not limitative to the scope of the disclosure, the scope of the disclosure is defined by the accompanying claims.

What is claimed is:

1. A repair method of a splicing seam of a splicing nano-imprint template, comprising:
   providing a splicing nano-imprint plate, wherein the splicing nano-imprint plate comprises a base substrate and a plurality of splicing modules that are positioned on the base substrate, a splicing seam is provided between adjacent spicing modules, and each of the splicing modules comprises a unit pattern;
   forming a repair adhesive layer at least at the splicing seam; and
   performing a patterning process on the repair adhesive layer to form a repair module, wherein the repair module comprises the unit pattern, wherein
   the repair adhesive layer is an imprint adhesive layer; and
   the forming the repair adhesive layer at least at the splicing seam, comprises:
   forming an anti-sticking layer on the splicing modules, and
   forming the imprint adhesive layer at the splicing seam as the repair adhesive layer.

2. The repair method according to claim 1, wherein the performing the patterning process on the repair adhesive layer to form the repair module, comprises:
   imprinting the imprint adhesive layer by using an imprint template, wherein the imprint template comprises the unit pattern;
   performing a curing process on the imprint adhesive layer by taking an edge of the imprint template as a boundary; and
   separating the imprint template from the imprint adhesive layer to form the repair module.

3. The repair method according to claim 1, wherein the forming the anti-sticking layer on the splicing modules, comprises:
   forming the anti-sticking layer on the splicing modules by using a printing method, wherein a distance between an edge of the anti-sticking layer close to the splicing seam and an edge of one of the splicing modules close to the splicing seam is less than 1 micrometer.

4. The repair method according to claim 3, wherein the edge of the anti-sticking layer close to the splicing seam is aligned with the edge of the one of the splicing modules close to the splicing seam.

5. The repair method according to claim 1, wherein a material of the anti-sticking layer comprises fluorine-containing silane-based compounds.

6. A manufacturing method of a splicing nano-imprint template, comprising: the repair method according to claim 1, wherein the manufacturing method further comprises:
providing the base substrate, wherein the base substrate comprises a plurality of splicing regions and the splicing seam positioned between adjacent splicing regions;
forming the plurality of splicing modules by using a nano-imprint method; and
respectively fixing the plurality of splicing modules to the splicing regions of the base substrate to form the splicing nano-imprint plate.

7. A repair method of a splicing seam of a splicing nano-imprint template, comprising:
providing a splicing nano-imprint plate, wherein the splicing nano-imprint plate comprises a base substrate and a plurality of splicing modules that are positioned on the base substrate, a splicing seam is provided between adjacent spicing modules, and each of the splicing modules comprises a unit pattern;
forming a repair adhesive layer at least at the splicing seam; and
performing a patterning process on the repair adhesive layer to form a repair module, wherein the repair module comprises the unit pattern,
wherein the forming the repair adhesive layer at least at the splicing seam comprises:
forming a photoresist layer at the splicing seam as the repair adhesive layer
wherein the performing the patterning process on the repair adhesive layer to form the repair module comprises:
irradiating a portion of the photoresist layer by using a femtosecond laser so that the photoresist layer comprises a cured portion and an uncured portion; and
removing the uncured portion of the photoresist layer to form the repair module.

8. The repair method according to claim 7, wherein a wavelength range of the femtosecond laser is 700 nm-900 nm.

9. The repair method according to claim 8, wherein the wavelength of the femtosecond laser is 800 nm.

10. A splicing nano-imprint template, comprising:
a base substrate,
a nano-imprint structure, positioned on the base substrate, and comprising a plurality of splicing modules and a repair module that is positioned between adjacent splicing modules, wherein the repair module and each of the splicing modules comprise a unit pattern;
a splicing seam provided between adjacent spicing modules, and each of the splicing modules comprises a unit pattern; and
a repair adhesive layer provided at least at the splicing seam;
wherein the repair adhesive layer is an imprint adhesive layer, and
the repair adhesive layer comprises an anti-sticking layer on the splicing modules.

11. The splicing nano-imprint template according to claim 10, wherein an edge of one of the splicing modules close to the repair module is in direct contact with an edge of the repair module close to the one of the splicing modules.

12. The splicing nano-imprint template according to claim 10, wherein each of the splicing modules comprises a plurality of the unit patterns that are arranged according to a period, and the repair module comprises a plurality of the unit patterns that are arranged according to the period.

13. The splicing nano-imprint template according to claim 12, wherein at an interface where the repair module and one of the splicing modules contact with each other, the period is continuous.

14. The splicing nano-imprint template according to claim 13, wherein
each of the unit patterns comprises a groove and a protrusion that are alternately provided;
an edge of the one of the splicing modules close to the repair module is provided with the groove, and an edge of the repair module close to the one of the splicing modules is provided with the protrusion; or, the edge of the one of the splicing modules close to the repair module is provided with the protrusion, and the edge of the repair module close to the one of the splicing modules is provided with the groove.

15. The splicing nano-imprint template according to claim 12, wherein at an interface where the repair module and one of the splicing modules contact with each other, the period is discontinuous.

16. The splicing nano-imprint template according to claim 15, wherein
each of the unit patterns comprises a groove and a protrusion that are alternately provided;
an edge of the one of the splicing modules close to the repair module is provided with the groove, and an edge of the repair module close to the one of the splicing modules is provided with the groove; or, the edge of the one of the splicing modules close to the repair module is provided with the protrusion, and the edge of the repair module close to the one of the splicing modules is provided with the protrusion.

17. The splicing nano-imprint template according to claim 10, further comprising:
a seed layer, provided on a side of the nano-imprint structure away from the base substrate.

18. The splicing nano-imprint template according to claim 17, wherein a material of the seed layer comprises nickel and/or copper.

* * * * *